United States Patent
Basol et al.

(10) Patent No.: US 7,435,323 B2
(45) Date of Patent: Oct. 14, 2008

(54) METHOD FOR CONTROLLING THICKNESS UNIFORMITY OF ELECTROPLATED LAYERS

(75) Inventors: Bulent M. Basol, Manhattan Beach, CA (US); Paul Lindquist, Eagle, ID (US)

(73) Assignee: Novellus Systems, Inc., San Jose, CA (US)

( * ) Notice: Subject to any disclaimer, the term of this patent is extended or adjusted under 35 U.S.C. 154(b) by 653 days.

(21) Appl. No.: 10/869,850

(22) Filed: Jun. 18, 2004

(65) Prior Publication Data

US 2004/0231994 A1  Nov. 25, 2004

Related U.S. Application Data

(63) Continuation of application No. 09/855,059, filed on May 15, 2001, now Pat. No. 6,802,946.

(60) Provisional application No. 60/256,924, filed on Dec. 21, 2000.

(51) Int. Cl.
- *C25D 5/04* (2006.01)
- *C25D 5/22* (2006.01)
- *C25D 7/12* (2006.01)
- *C25F 3/16* (2006.01)

(52) U.S. Cl. .................... 205/93; 205/96; 205/123; 205/143; 205/663

(58) Field of Classification Search .............. 205/93, 205/96, 663

See application file for complete search history.

(56) References Cited

U.S. PATENT DOCUMENTS 3,328,273 A  6/1967  Creutz et al.

(Continued)

FOREIGN PATENT DOCUMENTS

WO  WO 98/27585  6/1998

(Continued)

OTHER PUBLICATIONS

Joseph M. Steigerwald et al., "Chemical Mechanical Planarization of Microelectronic Materials", A Wiley-Interscience Publication, 1997, by John Wiley & Sons, Inc. pp. 212-222.

(Continued)

*Primary Examiner*—Susy Tsang-Foster
*Assistant Examiner*—William T Leader
(74) *Attorney, Agent, or Firm*—Knobbe, Martens, Olson & Bear, LLP

(57) ABSTRACT

An apparatus which can control thickness uniformity during deposition of conductive material from an electrolyte onto a surface of a semiconductor substrate is provided. The apparatus has an anode which can be contacted by the electrolyte during deposition of the conductive material, a cathode assembly including a carrier adapted to carry the substrate for movement during deposition, and a conductive element permitting electrolyte flow therethrough. A mask lies over the conductive element and has openings permitting electrolyte flow. The openings define active regions of the conductive element by which a rate of conductive material deposition onto the surface can be varied. A power source can provide a potential between the anode and the cathode assembly so as to produce the deposition. A deposition process is also disclosed, and uniform electroetching of conductive material on the semiconductor substrate surface can additionally be performed.

34 Claims, 10 Drawing Sheets

U.S. PATENT DOCUMENTS

| | | | |
|---|---|---|---|
| 4,430,173 A | 2/1984 | Boudot et al. | |
| 4,643,816 A | 2/1987 | Geels | 204/230.3 |
| 4,678,545 A | 7/1987 | Galik | 205/50 |
| 4,948,474 A | 8/1990 | Miljkovic | |
| 4,954,142 A | 9/1990 | Carr et al. | |
| 4,975,159 A | 12/1990 | Dahms | |
| 5,084,071 A | 1/1992 | Nenadic et al. | |
| 5,256,565 A | 10/1993 | Bernhardt et al. | |
| 5,354,490 A | 10/1994 | Yu et al. | |
| 5,421,987 A | 6/1995 | Tzanavaras et al. | 205/133 |
| 5,516,412 A | 5/1996 | Andricacos et al. | |
| 5,620,581 A | 4/1997 | Ang | |
| 5,681,215 A | 10/1997 | Sherwood et al. | |
| 5,744,019 A | 4/1998 | Ang | |
| 5,755,859 A | 5/1998 | Brusic et al. | |
| 5,762,544 A | 6/1998 | Zuniga et al. | |
| 5,770,095 A | 6/1998 | Sasaki et al. | |
| 5,773,364 A | 6/1998 | Farkas et al. | |
| 5,793,272 A | 8/1998 | Burghartz et al. | |
| 5,795,215 A | 8/1998 | Guthrie et al. | |
| 5,807,165 A | 9/1998 | Uzoh et al. | |
| 5,840,629 A | 11/1998 | Carpio | |
| 5,858,813 A | 1/1999 | Scherber et al. | |
| 5,884,990 A | 3/1999 | Burghartz et al. | |
| 5,897,375 A | 4/1999 | Watts et al. | |
| 5,911,619 A | 6/1999 | Uzoh et al. | |
| 5,922,091 A | 7/1999 | Tsai et al. | |
| 5,930,669 A | 7/1999 | Uzoh | |
| 5,933,753 A | 8/1999 | Simon et al. | |
| 5,954,997 A | 9/1999 | Kaufman et al. | |
| 5,985,123 A | 11/1999 | Koon | |
| 6,004,440 A | 12/1999 | Hanson et al. | |
| 6,004,880 A | 12/1999 | Liu et al. | |
| 6,027,631 A | 2/2000 | Broadbent | |
| 6,042,712 A | 3/2000 | Mathieu | 205/209 |
| 6,051,117 A | 4/2000 | Novak et al. | 204/252 |
| 6,063,506 A | 5/2000 | Andricacos et al. | |
| 6,066,030 A | 5/2000 | Uzoh | |
| 6,071,388 A | 6/2000 | Uzoh | |
| 6,074,544 A | 6/2000 | Reid et al. | |
| 6,103,085 A | 8/2000 | Woo et al. | |
| 6,106,687 A | 8/2000 | Edelstein | 205/98 |
| 6,132,583 A | 10/2000 | Stone | 205/96 |
| 6,132,587 A | 10/2000 | Jorne et al. | 205/123 |
| 6,136,163 A | 10/2000 | Cheung et al. | |
| 6,139,703 A | 10/2000 | Hanson et al. | 204/212 |
| 6,176,992 B1 | 1/2001 | Talieh | |
| 6,197,182 B1 | 3/2001 | Kaufman et al. | 205/159 |
| 6,231,743 B1 * | 5/2001 | Etherington | 205/83 |
| 6,251,251 B1 | 6/2001 | Uzoh et al. | 205/99 |
| 6,297,155 B1 | 10/2001 | Simpson et al. | 438/687 |
| 6,299,741 B1 | 10/2001 | Sun et al. | 204/224 M |
| 6,354,916 B1 * | 3/2002 | Uzoh et al. | 451/41 |

FOREIGN PATENT DOCUMENTS

| | | |
|---|---|---|
| WO | WO 00/26443 | 5/2000 |

OTHER PUBLICATIONS

Robert D. Mikkola et al., "Investigation of the Roles of the Additive Components for Second Generation Copper Electroplating Chemistries Used for Advanced Interconnect Metalization", 2000 IEEE, IEEE Electron Devices Society, pp. 117-119.

James J. Kelly et al., "Leveling and Microstructural Effects of Additives for Copper Electrodeposition", Journal of the Electrochemical Society, 1999, pp. 2540-2545.

* cited by examiner

METHOD FOR CONTROLLING THICKNESS UNIFORMITY OF ELECTROPLATED LAYERS

This application is a continuation of U.S. patent application Ser. No. 09/855,059, filed May 15, 2001, now U.S. Pat. No. 6,802,946, which claims the priority of U.S. provisional application No. 60/256,924, filed Dec. 21, 2000, the disclosures of which are expressly incorporated by reference herein.

BACKGROUND OF THE INVENTION

1. Field of the Invention

The present invention generally relates to electrodeposition process technology and, more particularly, to an electrodeposition process and apparatus that yield planar deposition layers.

2. Description of Related Art

A conventional semiconductor device generally includes a semiconductor substrate, usually a silicon substrate, and a plurality of sequentially formed dielectric interlayers, such as silicon dioxide interlayers, and conductive paths or interconnects made of conductive materials. The interconnects are usually formed by filling a conductive material in trenches etched into the dielectric interlayers. In an integrated circuit, multiple levels of interconnect networks laterally extend with respect to the substrate surface. The interconnects formed in different layers can be electrically connected using vias or contacts. A conductive material filling process of filling such features, i.e. via openings, trenches, pads or contacts, can be carried out by depositing a conductive material over the substrate including such features. Excess conductive material on the substrate can then be removed using a planarization and polishing technique such as chemical mechanical polishing (CMP).

Copper (Cu) and Cu alloys have recently received considerable attention as interconnect materials because of their superior electromigration and low resistivity characteristics. The preferred method of Cu deposition is electrodeposition. During fabrication, copper is electroplated or electrodeposited on substrates that are previously coated with barrier and seed layers. Typical barrier materials generally include tungsten (W), tantalum (Ta), titanium (Ti), their alloys and their nitrides. A typical seed layer material for copper is usually a thin layer of copper that is CVD or PVD deposited on the aforementioned barrier layer.

There are many different Cu plating system designs. For example, U.S. Pat. No. 5,516,412, issued on May 14, 1996 to Andricacos et al., discloses a vertical paddle plating cell that is configured to electrodeposit a film on a flat article. U.S. Pat. No. 5,985,123, issued on Nov. 16, 1999 to Koon, discloses yet another vertical electroplating apparatus which purports to overcome the non-uniform deposition problems associated with varying substrate sizes.

During the Cu electrodeposition process, specially formulated plating solutions or electrolytes are used. These solutions or electrolytes contain ionic species of Cu and additives to control the texture, morphology, and plating behavior of the deposited material. Additives are needed to make the deposited layers smooth and somewhat shiny.

FIGS. 1 through 2 exemplify a conventional electrodeposition method and apparatus. FIG. 1A illustrates a substrate 10 having an insulator layer 12 formed thereon. Using conventional etching techniques, features such as a row of small vias 14 and a wide trench 16 are formed on the insulator layer 12 and on the exposed regions of the substrate 10. Typically, the widths of the vias 14 are sub-micronic. The trench 16 shown in this example, on the other hand, is wide and has a small aspect ratio. The width of the trench 16 may be five to fifty times or more greater than its depth.

FIGS. 1B-1C illustrate a conventional method for filling the features with copper material. FIG. 1B illustrates that a barrier/glue or adhesion layer 18 and a seed layer 20 are sequentially deposited on the substrate 10 and the insulator 12. After depositing the seed layer 20, as shown in FIG. 1C, a conductive material layer 22 (e.g., a copper layer) is partially electrodeposited thereon from a suitable plating bath or bath formulation. During this step, an electrical contact is made to the copper seed layer 20 and/or the barrier layer 18 so that a cathodic (negative) voltage can be applied thereto with respect to an anode (not shown). Thereafter, the copper material layer 22 is electrodeposited over the substrate surface using plating solutions, as discussed above. By adjusting the amounts of the additives, such as chloride ions, a suppressor/inhibitor, and an accelerator, it is possible to obtain bottom-up copper film growth in the small features.

As shown in FIG. 1C, the copper material 22 completely fills the vias 14 and is generally conformal in the large trenches 16, because the additives that are used are not operative in large features. Here, the Cu thickness t1 at the bottom surface of the trench 16 is about the same as the Cu thickness t2 over the insulator layer 12. As can be expected, to completely fill the trench 16 with the Cu material, further plating is required. FIG. 1D illustrates the resulting structure after additional Cu plating. In this case, the Cu thickness t3 over the insulator layer 12 is relatively large and there is a step height s1 from the top of the Cu layer on the insulator layer 12 to the top of the Cu layer 22 in the trench 16. For IC applications, the Cu layer 22 needs to be subjected to CMP or other material removal processes so that the Cu layer 22 as well as the barrier layer 18 on the insulator layer 12 are removed, thereby leaving the Cu layer only within the features 14 and 16. These removal processes are known to be quite costly.

Methods and apparatus to achieve a generally planar Cu deposit as illustrated in FIG. 1E would be invaluable in terms of process efficiency and cost. The Cu thickness t5 over the insulator layer 12 in this example is smaller than the traditional case as shown in FIG. 1D, and the step height s2 is also much smaller than the step height s1. Removal of the thinner Cu layer in FIG. 1E by CMP or other methods would be easier, providing important cost savings.

In U.S. Pat. No. 6,176,992 B1 entitled "Method and Apparatus for Electrochemical Mechanical Deposition", commonly owned by the assignee of the present invention, an electrochemical mechanical deposition (ECMD) technique is disclosed that achieves deposition of the conductive material into cavities on a substrate surface while minimizing deposition on the field regions by polishing the field regions with a pad as the conductive material is deposited, thus yielding planar copper deposits. The plating electrolyte in this application is supplied to the small gap between the pad and the substrate surface through a porous pad or through asperities in the pad.

Co-pending U.S. patent application Ser. No. 09/511,278, entitled "Pad Designs and Structures for a Versatile Materials Processing Apparatus" filed Feb. 23, 2000, now U.S. Pat. No. 6,413,388 B1, which is commonly owned by the assignee of the present invention, describes various shapes and forms of holes in pads through which electrolyte flows to a wafer surface.

Another invention described in U.S. patent application Ser. No. 09/740,701, entitled "Plating Method and Apparatus That Creates a Differential Between Additive Disposed on a Surface and a Cavity Surface of a Work Piece Using an External Influence", filed Dec. 18, 2000, provides a method and apparatus for "mask-pulse plating" a conductive material onto a substrate by intermittently moving the mask, which is placed between the substrate and the anode, into contact with the substrate surface and applying power between the anode and the substrate during the process. Yet another invention described in U.S. patent application Ser. No. 09/735,546, entitled "Method of and Apparatus for Making Electrical Contact to Wafer Surface For Full-Face Electroplating or Electropolishing", filed Dec. 14, 2000, now U.S. Pat. No. 6,482,307, provides complete or full-face electroplating or electropolishing of the entire wafer frontal side surface without excluding any edge area for the electrical contacts. This method uses an anode having an anode area, and electrical contacts placed outside the anode area. During the process, the wafer is moved with respect to the anode and the electrical contacts such that a full-face deposition over the entire wafer frontal surface is achieved. Another non-edge-excluding process described in U.S. patent application Ser. No. 09/760,757, entitled "Method and Apparatus for Electrodeposition of Uniform Film with Minimal Edge Exclusion on Substrate", filed Jan. 17, 2001, also achieves full-face deposition with a system having a mask or a shaping plate placed between the wafer frontal surface and the anode. The mask contains asperities allowing electrolyte flow. In this system, the mask has a larger area than the wafer surface. The mask is configured to have recessed edges through which electrical contacts can be contacted with the front surface of the wafer. In this system, as the wafer is rotated, the full surface of the wafer contacts with the electrolyte flowing through the shaping plate, achieving deposition.

FIG. 2A shows a schematic depiction of a prior art electrodeposition system 30. In this system, a wafer 32 is held by a wafer holder 34 with the help of a ring clamp 36 covering the circumferential edge of the wafer 32. An electrical contact 38 is also shaped as a ring and connected to the (−) terminal of a power supply for cathodic plating. The wafer holder 34 is lowered into a plating cell 40 filled with plating electrolyte 42. An anode 44, which makes contact with the electrolyte 42, is placed across from the wafer surface and is connected to the (+) terminal of the power supply. The anode 44 may be made of the material to be deposited, i.e. copper, or may be made of an appropriate inert anode material such as platinum, platinum coated titanium or graphite. A plating process commences upon application of power. In this plating system, the electrical contact 38 is sealed from the electrolyte and carries the plating current through the circumference of the wafer 32.

FIGS. 1A through 1E show how the features on the wafer surface are filled with copper. For this filling process to be efficient and uniform throughout the wafer, it is important that a uniform thickness of copper be deposited over the whole wafer surface. Also, the resulting thickness uniformity of the plating process, i.e. the uniformity of thickness t3 in FIG. 1D and the uniformity of the thickness t5 in FIG. 1E, needs to be very good (typically less than 10% variation, and preferably less than 5% variation) because a non-uniform copper thickness causes problems during the CMP process.

As shown in FIG. 2B, in order to improve uniformity of the deposited layers, shields 46 may be included in the prior art electroplating system such as that shown in FIG. 2A. In such systems, either the wafer 32 or the shield 46 may be rotated. Such shields are described, for example, in U.S. Pat. No. 6,027,631 to Broadbent, U.S. Pat. No. 6,074,544 to Reid et al., and U.S. Pat. No. 6,103,085 to Woo et al. Further, in such systems, electrical thieves can be used for electrodepositing materials. Such thieves are described, for example, in U.S. Pat. Nos. 5,620,581 and 5,744,019 to Ang, U.S. Pat. No. 6,071,388 to Uzoh, and U.S. Pat. Nos. 6,004,440 and 6,139,703 to Hanson et al.

In view of the foregoing, there is a need for alternative electrodeposition processes and systems that deposit uniform conductive films and have the ability to change deposition rates on various portions of a substrate during the deposition process.

SUMMARY OF THE INVENTION

In one aspect of the present invention, a system for electrodepositing a conductive material on a surface of a wafer is provided. The system includes an anode, a mask having upper and lower surfaces, a conductive mesh positioned below the upper surface of the mask or shaping plate, and an electrolyte. The mask includes a plurality of openings extending between the upper and lower surfaces, and the mask is supported between the anode and the surface of the wafer. The conductive mesh is positioned below the upper surface of the mask such that the plurality of openings of the mask defines a plurality of active regions on the conductive mesh. The conductive mesh is connected to a first electrical power input. The liquid electrolyte flows through the openings of the mask and through the active areas of the mesh so as to contact the surface of the wafer.

Another feature of the invention is the provision of an apparatus which can control thickness uniformity during deposition of conductive material from an electrolyte onto a surface of a semiconductor substrate. The apparatus includes an anode which can be contacted by the electrolyte during deposition, a cathode assembly including a carrier adapted to carry the substrate for movement during deposition, a conductive element permitting electrolyte flow therethrough, and a mask lying over the conductive element. The mask has openings, permitting electrolyte flow therethrough, which define active regions of the conductive element by which a rate of conductive material deposition onto the surface can be varied. A power source can provide a potential between the anode and the cathode assembly so as to produce the deposition.

Preferably, the conductive element is a conductive mesh, and includes a plurality of electrically isolated sections. At least one isolation member or gap can separate the electrically isolated sections. The electrically isolated sections can be connected to separate control power sources.

In one configuration, the conductive element can be sandwiched between top and bottom mask portions which together define the mask. The conductive element could be placed under a lower surface of the mask. One of the electrically isolated sections may circumferentially surround another of the electrically isolated sections.

The electrically isolated sections could be irregularly shaped. Alternatively, one of the electrically isolated sections can be ring shaped while the other of these sections is disc shaped. The electrically isolated sections could additionally define adjacent strips.

At least one control power source can be used to supply a voltage to at least one of the electrically isolated sections to vary the rate of conductive material deposition onto a region of the substrate surface. In one configuration, the rate can be increased or decreased. Apparatuses such as those mentioned can be used to control thickness uniformity during conductive material deposition in a process including contacting the anode with the electrolyte, providing a supply of the electrolyte to the substrate surface through the conductive element and through the mask lying over the conductive element, providing a potential between the anode and the surface, and supplying a voltage to the conductive element in order to vary the conductive material deposition rate.

Uniform electroetching of conductive material on the wafer surface by reversing polarities of the anode and the cathode assembly is also within the scope of this invention. A process for establishing a relationship between deposition currents in active regions on the conductive mesh and thicknesses of the conductive material deposited onto the semiconductor substrate surface is also contemplated.

These and other features, aspects and advantages of the present invention will become better understood with reference to the drawings and the following description.

DETAILED DESCRIPTION OF THE INVENTION

The present invention provides a method and a system to control the uniformity of a conductive material layer deposited on a surface of a semiconductor. The invention can be used with ECMD, mask pulse plating and full face plating as well as plating systems that deposit conformal films. The deposition process of the present invention advantageously achieves deposition of a conductive material in a plurality of cavities, such as trenches, vias, contact holes and the like, on a surface of a semiconductor wafer.

As is known, during an electrodeposition process of a surface of a wafer, the current density applied to the surface is substantially greater at the periphery of the surface than the center of the surface. In the prior art, this higher current density results in an increased deposition rate of the deposited film at the periphery of the wafer as compared to the wafer center. With the present invention, the film thickness difference between the interior and the periphery of the wafer may be eliminated with use of the combination of the perforated plate or a mask and a conductive mesh of the present invention during the electrodeposition. The combination of the perforated plate and the conductive mesh facilitates uniform deposition of the conductive material.

Further, in another embodiment, the present invention achieves deposition of the conductive material through the combination of the perforated plate and the conductive mesh into the features of the surface of the wafer while minimizing the deposition on the top surface regions between the features by contacting, sweeping and/or polishing of the surface with the perforated plate of the present invention. For systems that can deposit planar films, i.e., ECMD, mask pulse plating and full face plating, the thickness uniformity can be controlled to a certain extent through designing the shape, size and location of the openings in the mask, pad or shaping plates that are employed. Although effective for a given process parameters, such approaches may not be flexible enough to have a dynamic control over the uniformity of the deposition process.

The apparatus and the process of the present invention exhibit enhanced deposition characteristics resulting in layers having flatness previously unattainable and conductive layers with materials characteristics surpassing that of prior art layers that have been produced using prior art processes and devices.

Figure 1A:
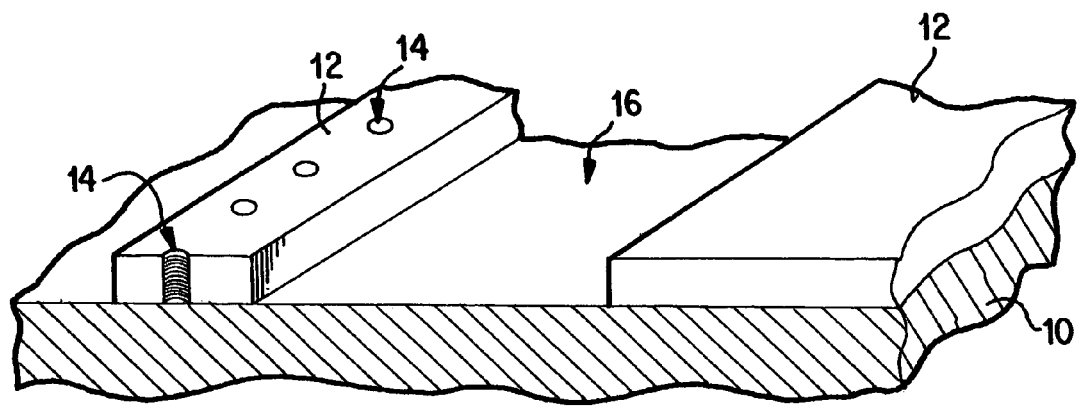
FIG. 1A is a partial sectional view of a semiconductor substrate with an overlying insulator layer including trenches and vias.
Figure 1B:
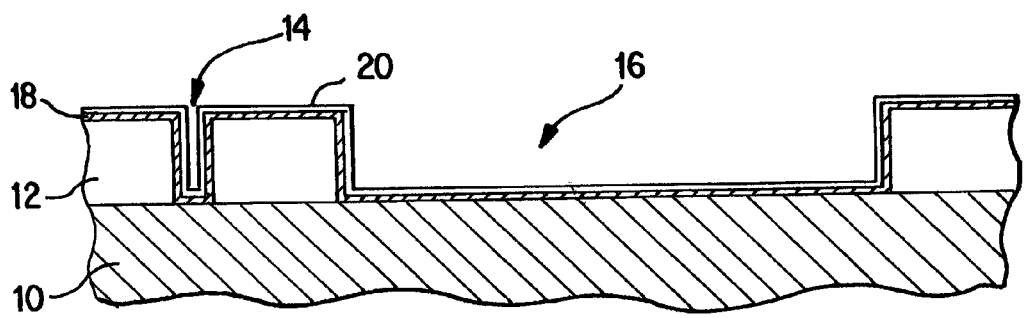
FIGS. 1B and 1C are cross sectional views illustrating a conventional method for filling trenches and vias, such as those of FIG. 1A, with a conductive material.
Figure 1C:
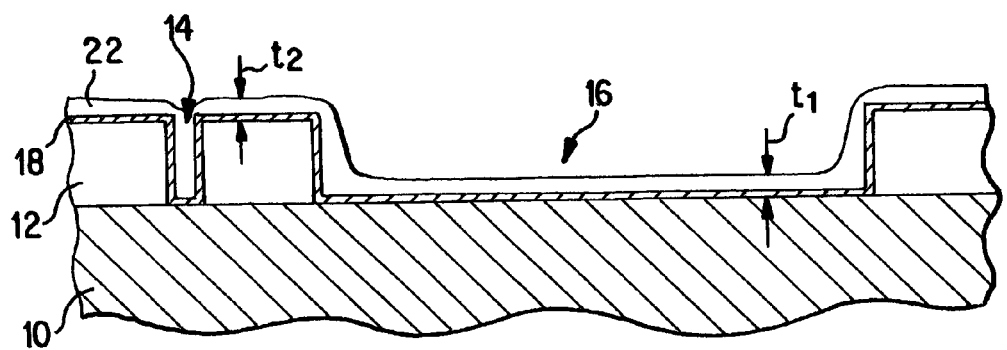
Figure 1D:
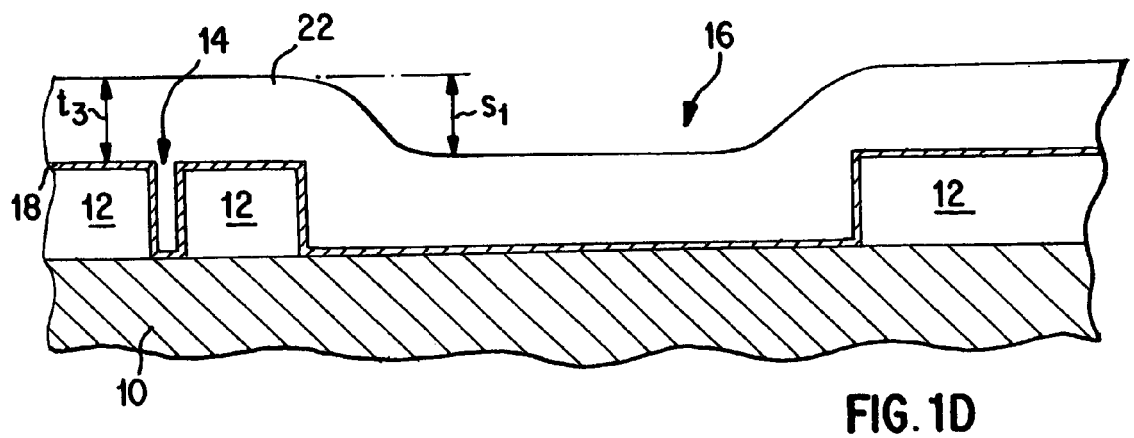
FIG. 1D is a cross sectional view showing a structure similar to that of FIG. 1C but after additional conductive material deposition.
Figure 1E:
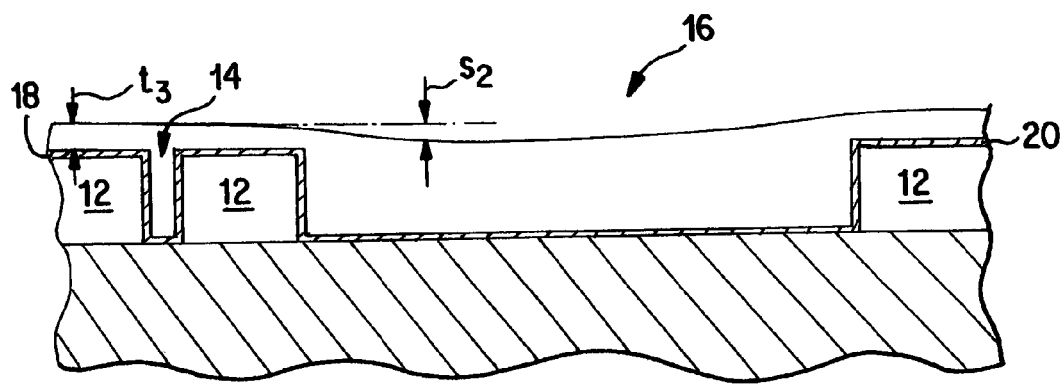
FIG. 1E is a view similar to FIG. 1D but showing a structure with a reduced conductive material thickness over an insulator layer.
Figure 2A:
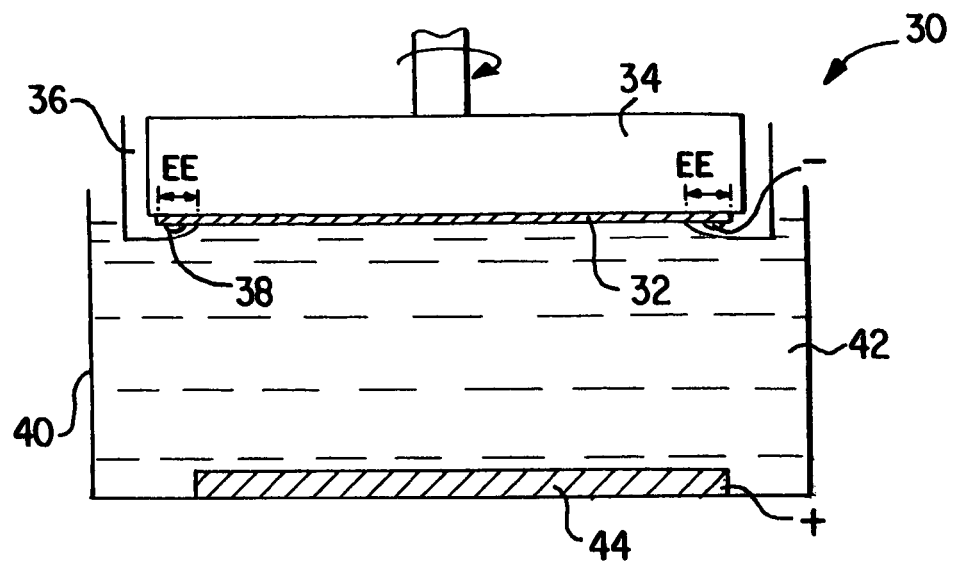
FIG. 2A is a schematic illustration, in cross section, of a known electrodeposition system.
Figure 2B:
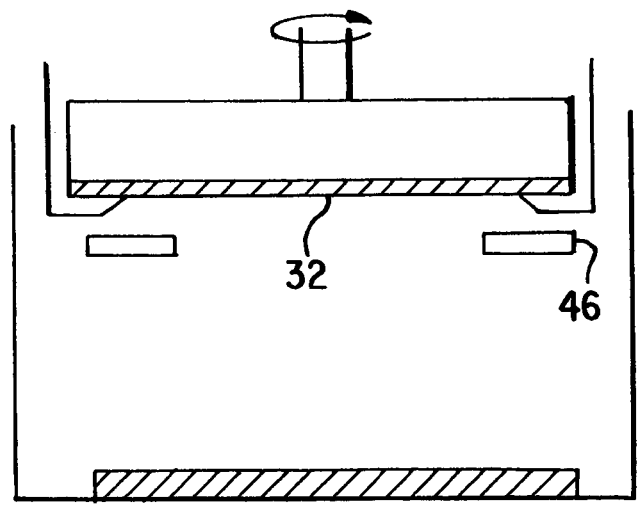
FIG. 2B is a schematic illustration similar to FIG. 2A but showing a system which includes shields intended to improve deposition uniformity.
Figure 3:
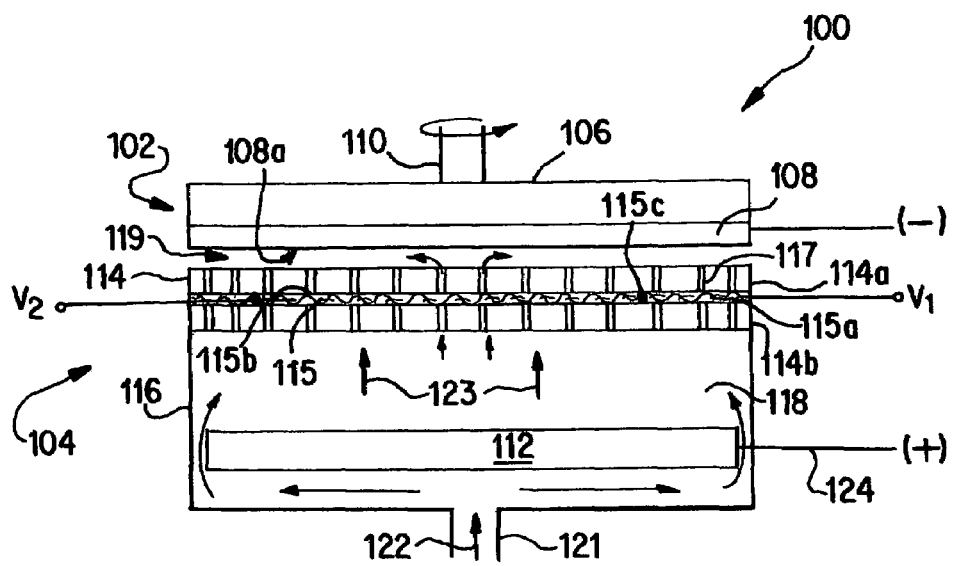
FIG. 3 is a schematic cross sectional illustration of one embodiment of an electrodeposition system according to this invention.

Reference will now be made to the drawings wherein like numerals refer to like parts throughout. As shown in FIG. 3, an electrodeposition system 100 of the present invention may preferably comprise a cathode assembly 102 and an anode assembly 104. The system 100 may be used to deposit a conductive material such as copper on a semiconductor wafer such as silicon wafer. Although copper is used as an example, the present invention may be used for deposition of other common conductors such as Ni, Pd, Pt, Au and their alloys. The cathode assembly 102 of the electrodeposition system 100 may be comprised of a wafer carrier 106, shown in FIG. 3 holding an exemplary wafer 108, which is attached to a carrier arm 110. The carrier arm may rotate or move the wafer 108 laterally or vertically.

The anode assembly 104 of the system 100 may be comprised of an anode 112, preferably a consumable copper anode, a mask, and a conductive mesh 115 of the present invention. The mask, as shown, is in the form of a mask plate 114. The anode 112 may preferably be placed into an enclosure such as an anode cup 116 which may be enclosed by the mask plate 114 and the conductive mesh 115 as in the manner shown in FIG. 3. The mask plate 114 and the mesh 115 are both perforated plates. The mask plate preferably comprises a first mask portion 114a or a top mask portion and a second mask portion 114b or a bottom mask portion. The mesh 115 may be interposed or sandwiched between the top and bottom portions 114a, 114b. The mask plate 114 may comprise a plurality of openings or asperities 117 which allow a copper plating electrolyte 118 to flow through the mask plate 114 and the mesh 115, and wet the front surface 108a of the wafer 108 and deposit material on the front surface 108a of the wafer under applied potential. The asperities 117 in the top and bottom mask portions may generally be aligned to allow electrolyte flow through the top and bottom mask portions 114a, 114b. However, their partial alignment or placement in any other way that still allows electrolyte flow through the top mask portion 114a to the wafer surface is also within the scope of this invention. During the electrodeposition process, the wafer surface 108a may be kept substantially parallel to an upper surface 119 of the mask plate 114 and rotated. It should be understood that what counts is the relative motion between the wafer surface and the pad surface. This motion can be a rotational motion or a rotation motion with linear translation.

The mesh 115 may have first and second sections 115a and 115b that are electrically isolated from each other by an isolation member 115c. The isolation member 115c may be a gap separating both sections. The first section 115a may be connected to a first control power source V1 and the second section may be connected to a second control power source V2. If the control power supplies impart a negative voltage on the mesh sections, this results in some material deposition on the sections 115a and 115b during the electrodeposition, i.e. some deposition is "stolen" directly across from these sections. On the other hand, if a positive voltage is applied to the mesh with respect to the wafer surface, the section of the wafer across from the section of the mesh with positive voltage receives more plating. As will be described below, with the applied power V1 and in combination with the functionalities of the mask asperities, the first section 115a of the mesh 115 may, for example, control the thickness at the periphery of the front surface 108a of the wafer 108. In this respect, the second power V2 on the second section 115b controls the thickness on the center or near center regions of the front surface 108a. During the deposition process, the electrolyte 118 is pumped into the anode cup 116 through a liquid inlet 121 in the direction of arrow 122, and then in the direction of arrows 123 so as to reach and wet the surface 108a of the wafer 108 which is rotated. The anode 112 is electrically connected to a positive terminal of a power source (not shown) through an anode connector 124. The wafer 108 is connected to a negative terminal of the power source (not shown). The anode 112 may have holes in it (not shown). Additionally, the anode may have an anode bag or filter around the anode to filter particles created during the deposition process. The mask plate 114 and the anode cup 116 may have bleeding openings (not shown) to control the flow of electrolyte.

Figure 4:
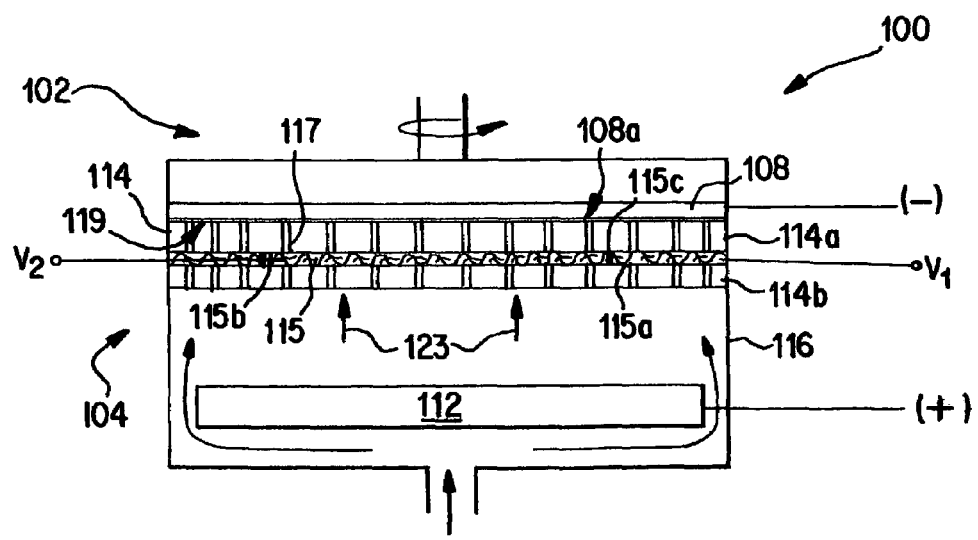
FIG. 4 shows the system of FIG. 3 when used to provide substantially flat conductive material deposition.

As shown in FIG. 4, a planar electrodeposition process can also be employed. In this case, the cathode assembly 102 may be lowered toward the anode assembly 104 and the front surface 108a of the wafer 108 is contacted with the upper surface 119 of the mask 114 while the wafer 108 is rotated. In this embodiment, the mask 114 may be made of a rigid material such as a hard dielectric material, or, optionally, the upper surface 119 of the mask 114 may contain rigid abrasive materials. During this process, addition of mechanical polishing or sweeping provides substantially flat deposition layers with controlled thickness.

Figure 5:
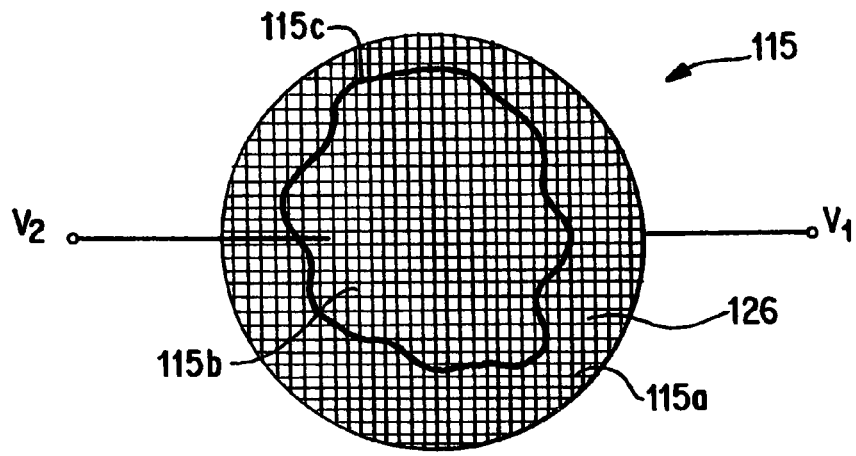
FIG. 5 is a top plan view of a conductive mesh, with irregularly shaped electrically isolated sections, which can be used in the embodiment of FIGS. 3 and 4.

FIG. 5 exemplifies the conductive mesh 115 and the sections 115a and 115b separated by the isolation member 115c. The mesh 115 comprises openings 126 allowing electrolyte to flow through the openings. The mesh 115 may be made of platinum or platinum coated titanium mesh or other inert conductive materials. After a cycle of 5 to 50 uses, the polarity of the system may be reversed and the mesh can be cleaned for another cycle of uses. The number of possible cycles, before cleaning, depends on the use of the mesh and the size of the mesh. Although two regions are shown in FIG. 5, the use of more than two regions is within the scope of this invention.

Figure 6A:
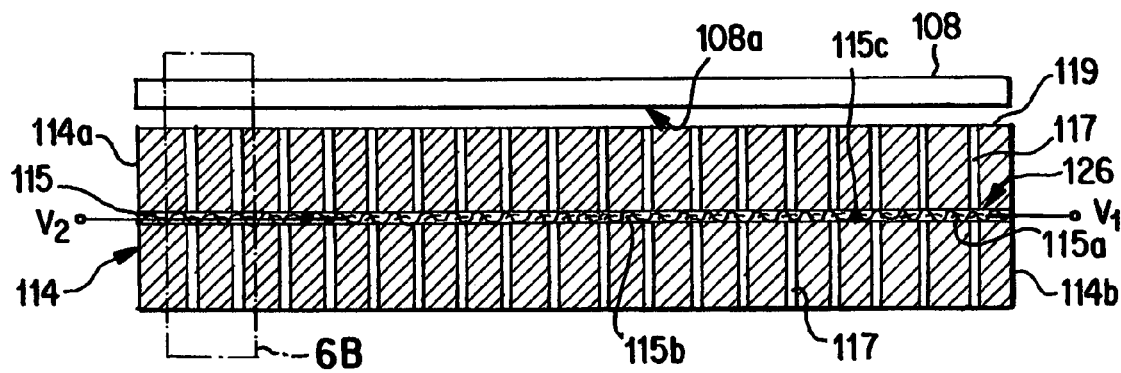
FIG. 6A is an enlarged cross sectional view showing a combined mask and mesh structure in proximity with a front surface of a semiconductor substrate.
Figure 6B:
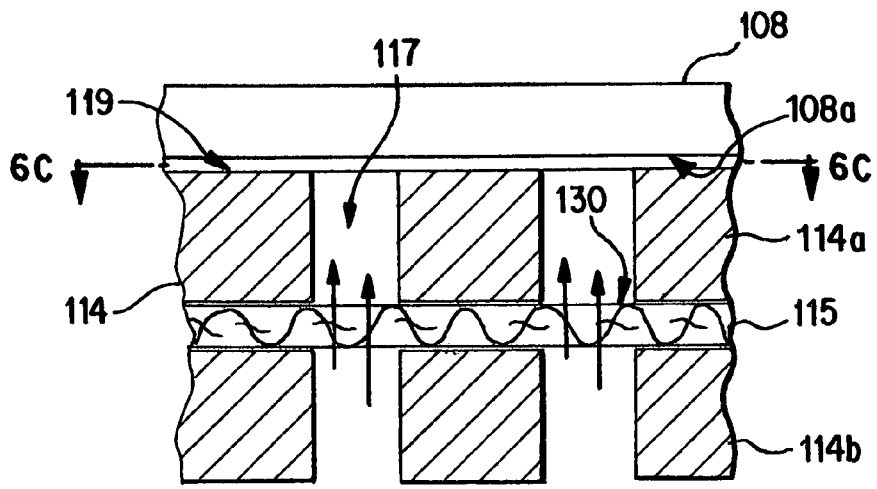
FIG. 6B is an enlarged view of section 6B appearing in FIG. 6A.
Figure 6C:
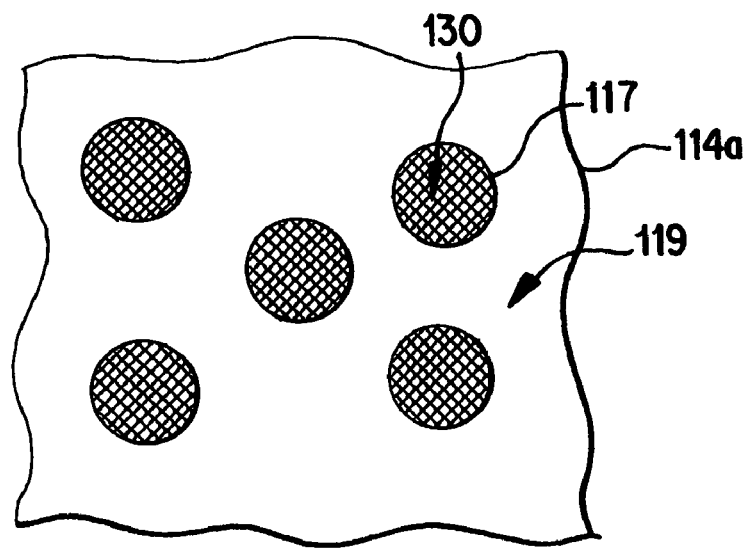
FIG. 6C is a partial plan view along line 6C-6C of FIG. 6B.

As shown in FIGS. 6A-6C, the mesh 115 may be placed between the top and bottom mask portions 114a, 114b using suitable fastening means or may be formed as an integral part of the mask 114. As shown in FIGS. 6B-6C, in side view and plan view respectively, when the mesh 115 and the mask 114 are combined, the openings 117 through the mask 114 define a plurality of active regions 130 on the mesh 115. During electrodeposition, when a negative potential is applied to the mesh 115, material deposition onto the active regions 130 occurs. If a positive voltage is applied, the active regions 130 of the mesh 115 become anodic and cause additional deposition on the wafer surface right above them. By varying the size and shape of the openings 117, the size and shape of the active regions 130 are changed. This, in turn, varies the deposition rates on the front surface 108a of the wafer 108 and hence alternatively controls the film thickness.

Figure 7:
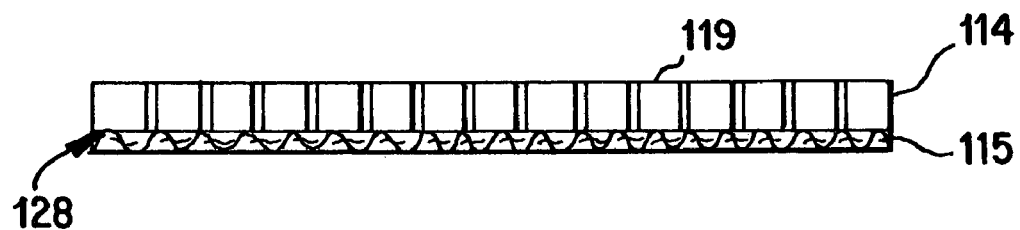
FIG. 7 shows another embodiment of a combined mask and mesh structure.

FIG. 7 illustrates another embodiment of a combined structure of the mask 114 and the mesh 115. In this embodiment, the mesh 115 is placed under a lower surface 128 of the mask plate 114. It is also within the scope of the present invention to position a plurality of meshes between the upper surface 119 and the lower surface 128 of the mask 114. Each of a plurality of meshes may be isolated from each other with a layer of mask, and each mesh may have a sequentially applied different power during the electrodeposition process to control the deposition rate.

Figure 8A:
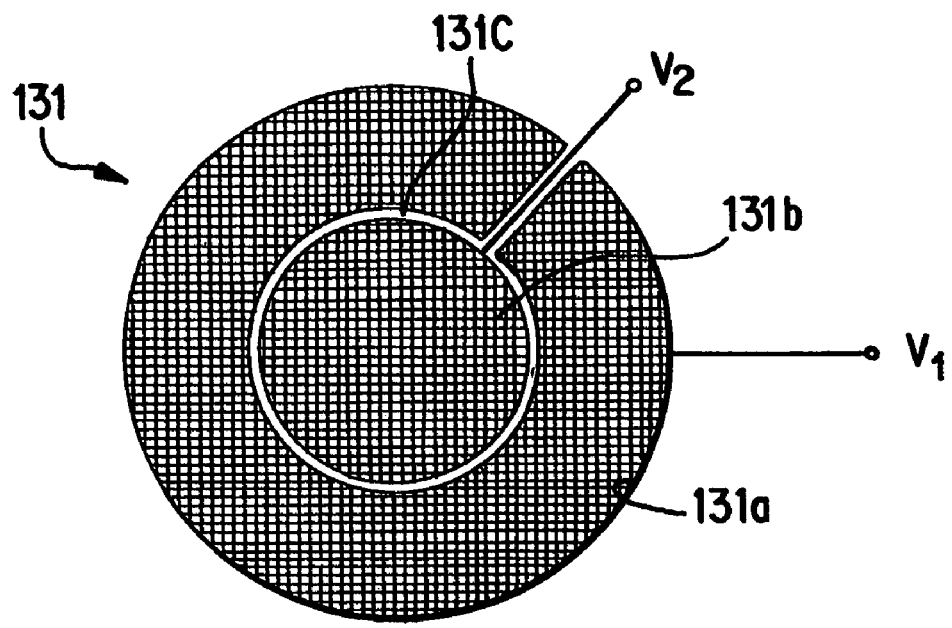
FIG. 8A is a top plan view of a conductive mesh similar to that of FIG. 5 but in which the electrically isolated sections are not irregularly shaped.
Figure 8B:
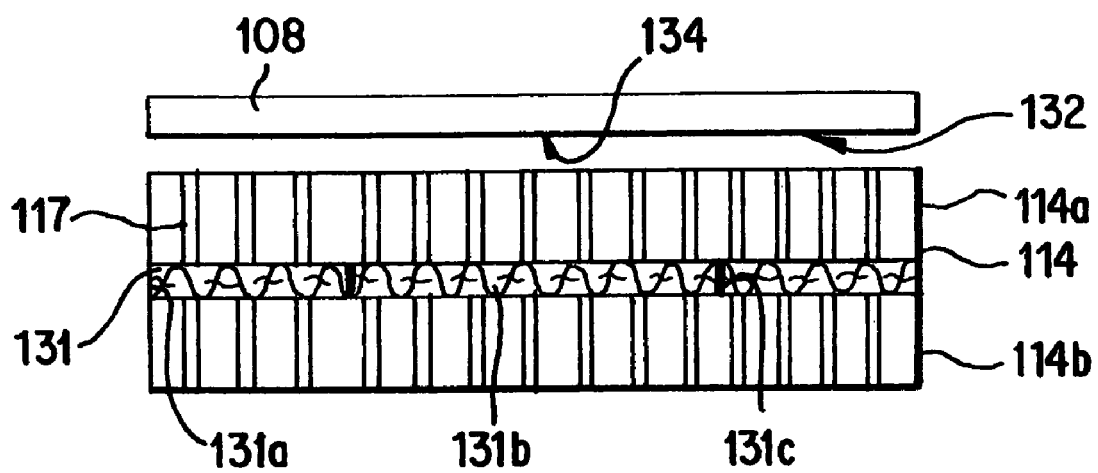
FIG. 8B shows the mesh of FIG. 8A as sandwiched between top and bottom mask portions in proximity with a front surface of a semiconductor substrate.

FIGS. 8A and 8B show another embodiment of the conductive mesh. In this embodiment, a mesh 131 comprises a first section 131a and a second section 131b isolated from one another by an isolation member 131c. The first section 131a is ring shaped and is fed by a first control power V1. As shown in FIG. 8B, the first section 131a controls the deposition thickness at a periphery 132 of the wafer 108. The second section 131b, which is disc shaped, controls the deposition thickness at the center 134 of the wafer 108 by a second control power V2.

Figure 9A:
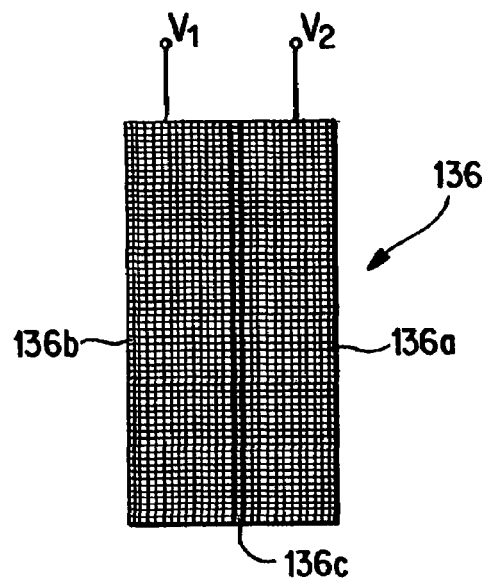
FIG. 9A is a top plan view of a conductive mesh with electrically isolated sections which define adjacent strips.
Figure 9B:
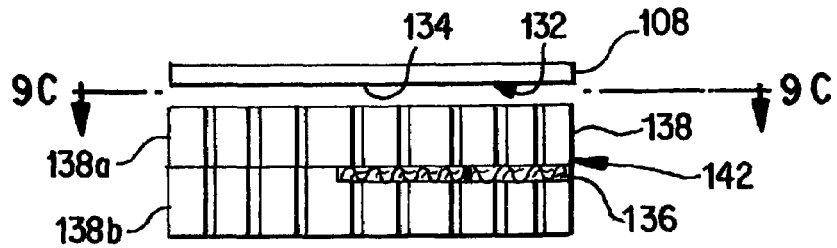
FIG. 9B is a view similar to that of FIG. 8B but showing the mesh of FIG. 9A as sandwiched between top and bottom mask portions.
Figure 9C:
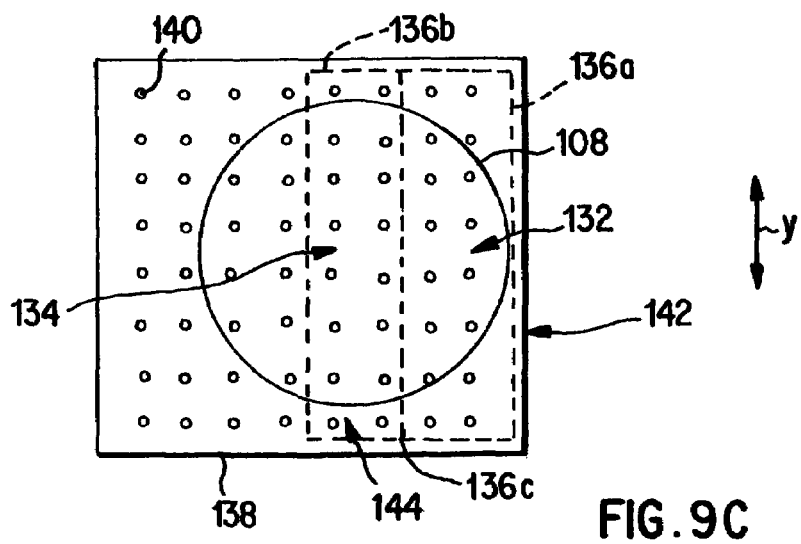
FIG. 9C is a plan view along line 9C-9C of FIG. 9B.

FIG. 9A-9C show another embodiment of a mesh 136 comprising a first section 136a and a second section 136b isolated from one another by an isolation member 136c. The first and second sections 136a, 136b are both strip shaped and may be used with a mask 138, which may have a circular or rectangular shape, having openings 140. Similar to the previous embodiments, the mask 138 may comprise a top portion 138a and a bottom portion 138b, and the mesh 136 may be sandwiched between the top and bottom portions 138a, 138b. As shown in FIGS. 9B and 9C, the first section 136a is aligned with a first end 142 of the mask 138 to control the deposition thickness at the periphery 132 of the wafer 108 which rotates during the electrodeposition process. The wafer 108 may be also moved in the direction Y. Similarly, the second section 136b is aligned with the center 144 of the mask 138 to control the deposition thickness of the center 134 of the wafer 108.

Of course, a uniform electroetching of the wafer surface by reversing polarities of the system 100 described above is also within the scope of this invention.

Figure 10:
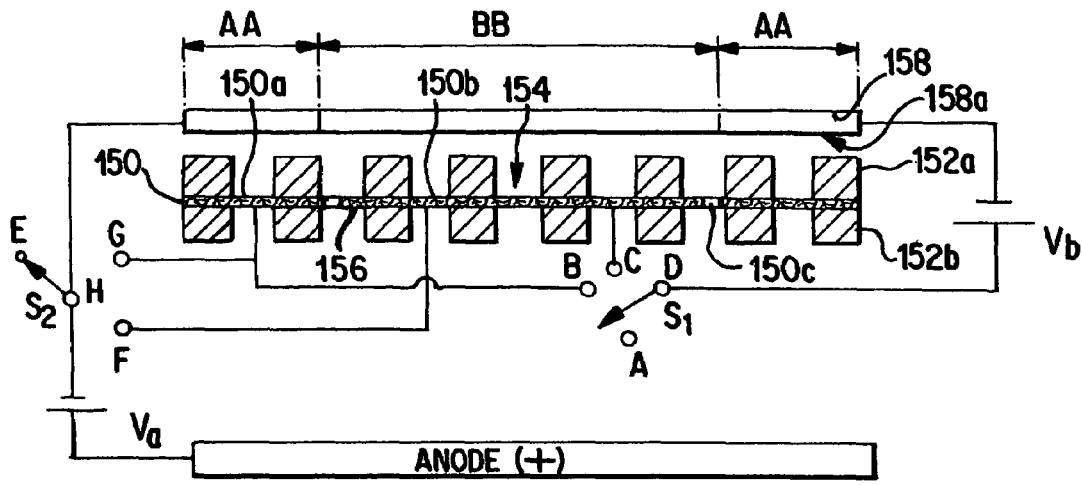
FIG. 10 is a schematic illustration of one system by which a mesh in accordance with any of the previously described embodiments can be energized.

FIG. 10 shows one embodiment of energizing the sections of the mesh described in the previous embodiments. In this embodiment, an exemplary mesh 150 may be interposed between a top portion 152a and a bottom portion 152b of a mask plate. The mask plate comprises a plurality of asperities 154 defining active areas 156 on the mesh 150. The mesh comprises a first or peripheral section 150a and a second or central section 150b which are isolated from one another by an isolation member 150c. A first power source Va is connected to a wafer 158, having a conductive surface 158a and an anode of an anode cup (not shown) of an electrodeposition system such as those described with regard to FIGS. 3-4. The first power source Va may also be connected to the first section 150a or the second section 150b of the mesh 150 through a switch S2. A second power source Vb is connected to the wafer 158 and the first section 150a or the second section 150b of the mesh 150 through the switch S1.

Accordingly, if the switch S1 connects node D to node A, no voltage is applied to the mesh 150. If the switch S1 connects node D to node B, a positive voltage is applied to the section 150a of the mesh 150. Accordingly, additional deposition is achieved in the section or sections AA on the wafer surface 158a. Each section AA is positioned right across from a section 150a of the mesh 150. If the switch S1 connects node D to node C, the section BB on the wafer receives the additional deposit.

If the switch S2 connects node H to node E, regular deposition commences on the wafer surface 158a. If switch S2 connects node H to node G, section 150a of the mesh 150 is rendered cathodic, and therefore attracts deposition, reducing the amount of deposit on the section AA of the wafer surface 158a. Similarly, if S2 connects node H to node F, deposition on the section BB of the wafer surface 158a is reduced. Thus, the deposition rates in both sections AA and BB of the wafer can be controlled by selecting the proper positions for the switches S1 and S2.

Only one power supply is required if one multiplexes the meshes $M_1, M_2, M_3 \ldots M_n$ through switches $S_1, S_2, S_3 \ldots S_n$ as shown in FIGS. 11-14. Also, measuring the current through a series of resistors would be useful for designing better mask patterns in the system. This is especially required for the present cell design because it is a complex cell to computer model and the potential field is not uniform across the system.

Figure 11:
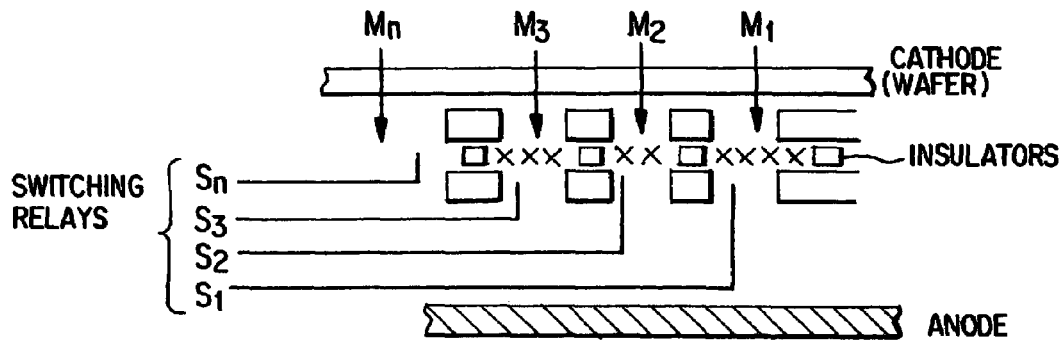
FIG. 11 is a schematic illustration of another system in which multiple meshes are multiplexed through multiple switches.
Figure 12:
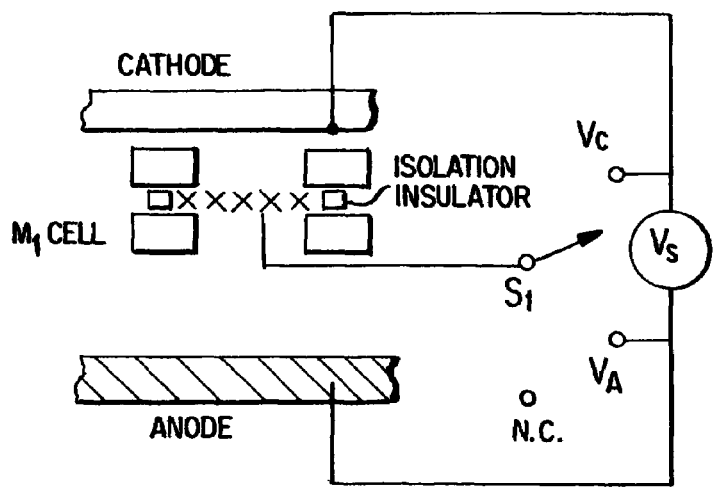
FIG. 12 is an enlarged view of part of the system shown in FIG. 11.
Figure 13:
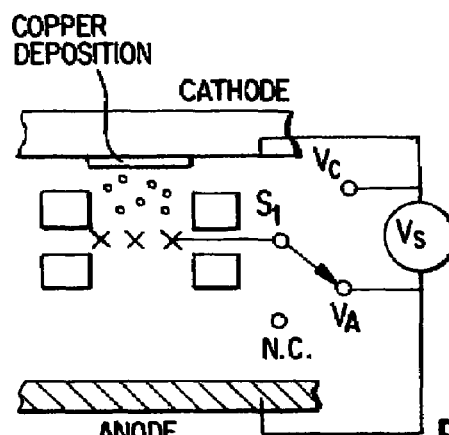
FIG. 13 is a view similar to FIG. 12 showing a switch in a position by which copper is plated from a mesh onto a wafer as well as from an anode onto the wafer.

Everything can be done with one power supply if many switches are used, as shown in FIG. 11. For example, looking at one micro-plating cell $M_1$ as shown in FIG. 12, switch $S_1$ can be used to change the amount of deposition on the cathode section over micro-plating cell $M_1$. In one case, shown in FIG. 13, when the switch $S_1$ is switched to the $V_A$ position, mesh $M_1$ is at potential $V_A$, and copper plates both from the mesh to the cathode and from the anode to the cathode.

Figure 14:
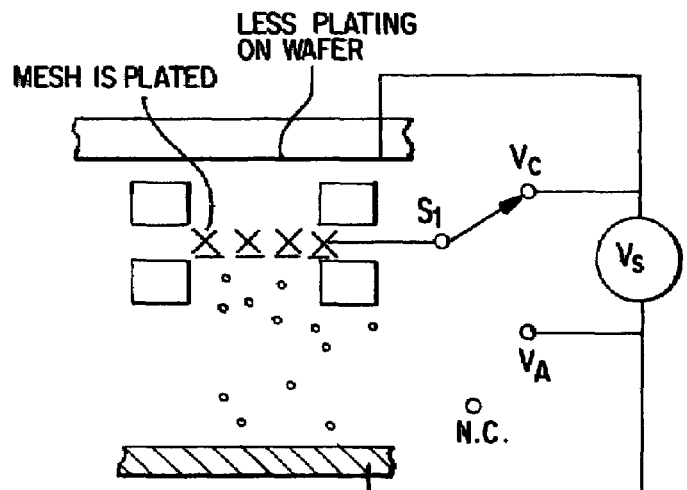
FIG. 14 is a view similar to FIG. 13 but showing the switch in a position by which copper is plated to the mesh so that less plating occurs on the wafer.

When the switch $S_1$ is switched to the $V_C$ position as shown in FIG. 14, the mesh $M_1$ is at a cathode potential and copper substantially plates to the mesh. To control thicknesses on different sections of the wafers, the duty cycles of switched meshes can be modulated in these regions.

If the switch $S_1$ is in the not connected ($N_C$) position, and is not connected to $V_A$ or $V_C$, then copper will plate as in a normal system.

Substantially isolated meshes, one for each opening in the mash, can also be used to determine the local current density of each opening in the mesh. Measuring this is helpful in designing and testing new mask patterns to get optimized or better control on the plated thickness uniformity.

Figure 15:
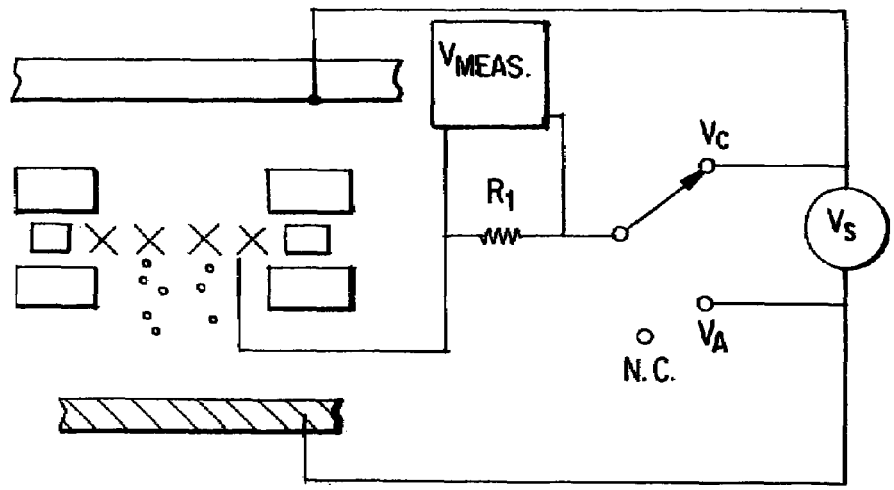
FIG. 15 is a schematic illustration of another system which can be used to correlate plating current to plated metal thickness measurements.

For one cell, referring to FIG. 15, in a first step, the voltage drop across the $R_1$ resistor is determined and the plating current for the particular cell is determined. This operation is then repeated in subsequent steps for every cell. Results are then mapped and compared to plated metal thickness measurements.

It should be understood, of course, that the foregoing relates to preferred embodiments of the invention and that modifications may be made without departing from the spirit and scope of the invention as set forth in the following claims.

The invention claimed is:

1. A process for controlling thickness uniformity during deposition of a conductive material from an electrolyte onto a surface of a substrate using an anode and a conductive element attached to a mask having openings, the process comprising:

placing the surface close to the conductive element of the mask;

contacting the anode with the electrolyte;

providing a supply of the electrolyte to the surface and the conductive element, the openings in the mask partially exposing the conductive element to the surface;

maintaining a potential difference between the anode and the surface;

applying at least one potential to the conductive element to vary a rate of conductive material deposition onto the surface;

establishing a relative motion between the substrate and the mask; and sweeping the surface of the substrate with the mask.

2. The process of claim 1, wherein sweeping comprises polishing the surface of the substrate with the mask.

3. The process of claim 1, wherein the step of applying the at least one potential comprises applying a plurality of potentials to the conductive member.

4. The process of claim 1, wherein the step of applying the at least one potential includes applying a first potential to a first section of the conductive element and a second potential to a second section of the conductive element.

5. The process of claim 4 further comprising the step of placing an edge region of the substrate close to the first section of the conductive element while placing the center region of the substrate close to the second section of the conductive element.

6. The process of claim 5, wherein placing the edge region close to the first section results in depositing the conductive material at a first deposition rate onto the edge region and placing the center region close to the second section results in depositing the conductive material at a second deposition rate onto the center region.

7. The process of claim 4, wherein applying the first potential to the first section results in depositing the conductive material at a first deposition rate onto a first region of the surface of the substrate and applying the second potential to the second section results in depositing the conductive material at a second deposition rate onto a second region of the surface of the substrate.

8. The process of claim 1, wherein the step of applying the at least one potential to the conductive element results in depositing the conductive material at a predetermined deposition rate onto the surface of the substrate.

9. The process of claim 1 further comprising the step of placing a first region of the surface of the substrate close to the conductive element to deposit conductive material at a predetermined deposition rate onto the first region.

10. The process of claim 9 further comprising the step of placing a second region of the surface of the substrate close to the conductive element to deposit conductive material at another predetermined rate onto the second region.

11. A process for controlling thickness uniformity during deposition of a conductive material from an electrolyte onto a surface of a semiconductor substrate using an anode and a conductive element attached to a mask having openings, the process comprising:
   placing the surface close to the conductive element of the mask;
   contacting the anode with the electrolyte;
   providing a supply of the electrolyte to the surface and a plurality of electrically isolated sections of the conductive element, the openings in the mask partially exposing the conductive element;
   maintaining a potential difference between the anode and the surface;
   applying at least one potential to at least one of the sections to vary a rate of conductive material deposition onto at least one region of the surface;
   establishing a relative motion between the substrate and the mask; and
   polishing the surface of the substrate with the mask.

12. The process of claim 11, wherein the step of applying the at least one potential to the at least one of the sections results in increasing the rate of conductive material deposition onto the at least one region of the substrate.

13. The process of claim 11, wherein the step of applying the at least one potential to the at least one of the sections results in decreasing the rate of conductive material deposition onto the at least one region of the substrate.

14. The process of claim 11, wherein the step of applying the at least one potential comprises applying a plurality of potentials to the plurality of the sections.

15. The process of claim 11, wherein the step of applying the at least one potential includes applying a first potential to a first section and a second potential to a second section of the conductive element.

16. The process of claim 15 further comprising the step of placing an edge region of the substrate close to the first section while placing the center region of the substrate close to the second section.

17. The process of claim 16, wherein placing the edge region close to the first section results in depositing the conductive material at a first deposition rate onto the edge region and placing the center region close to the second section results in depositing the conductive material at a second deposition rate onto the center region.

18. The process of claim 15, wherein applying a first potential to the first section results in depositing the conductive material at a first deposition rate onto a first region of the surface of the substrate and applying a second potential to the second section results in depositing the conductive material at a second deposition rate onto a second region of the surface of the substrate.

19. The process of claim 11 further comprising the step of placing a first region of the surface of the substrate close to one of the plurality of the sections to deposit conductive material at a predetermined rate onto the first region.

20. The process of claim 19 further comprising the step of placing a second region of the surface of the substrate close to one of the plurality of the sections to deposit conductive material at another predetermined rate onto the second region.

21. A process of electrochemical processing of a conductive material on a surface of a substrate using a solution that is in contact with an electrode and a conductive element attached to a mask, the mask having openings exposing the conductive element to the surface of the substrate, the process comprising:
   contacting the surface of the substrate with the surface of the mask;
   establishing a relative motion between the substrate and the mask;
   maintaining a potential difference between the surface and the electrode to initiate electrochemical processing of the conductive material on the surface;
   applying at least one potential to the conductive element to control the uniformity of electrochemical processing of the conductive material on the surface.

22. The process of claim 21, wherein contacting the surface of the substrate with the surface of the mask comprises polishing conductive material on the surface of the substrate with the mask.

23. The process of claim 22, wherein the electrochemical processing is electrochemical mechanical deposition.

24. The process of claim 22, wherein the electrochemical processing is electrochemical mechanical polishing.

25. The process of claim 21, wherein the electrochemical processing is electrochemical deposition.

26. The process of claim 21, wherein the electrochemical processing is electrochemical material removal.

27. The process of claim 21, wherein the step of applying the at least one potential comprises applying a plurality of potentials to the conductive element.

28. The process of claim 21, wherein the step of applying the at least one potential includes applying a first potential to a first section of the conductive element and a second potential to a second section of the conductive element.

29. The process of claim 28 further comprising the step of placing an edge region of the surface close to the first section of the conductive element while placing the center region of the surface close to the second section of the conductive element.

30. The process of claim 29, wherein placing the edge region close to the first section results in processing the conductive material on the edge region at a first processing rate and placing the center region close to the second section results in processing the conductive material on the center region at a second processing rate.

31. The process of claim 28, wherein applying a first potential to the first section results in processing the conductive material on a first region at a first processing rate and applying a second potential to the second section results in processing the conductive material on a second region at a second processing rate.

32. The process of claim 21, wherein the step of applying at least one potential to the conductive element results in processing the conductive material on the surface of the substrate at a predetermined processing rate.

33. The process of claim 21 further comprising the step of placing a first region of the surface of the substrate close to the conductive element to process the conductive material on the first region at a predetermined rate.

34. The process of claim 33 further comprising the step of placing a second region of the surface of the substrate close to the conductive element to process the conductive material on the second region at another predetermined rate.

* * * * *